United States Patent [19]

Hause et al.

[11] Patent Number: 5,786,130
[45] Date of Patent: Jul. 28, 1998

[54] MAPPING METHOD FOR A MICROSCOPE SLIDE

[76] Inventors: Lawrence L. Hause, 2306 Oakdale Dr., Waukesha, Wis. 53186; Dean Jeutter, 246 Oak St., Grafton, Wis. 53024

[21] Appl. No.: 546,177

[22] Filed: Oct. 20, 1995

[51] Int. Cl.⁶ .................................................. G03F 7/00
[52] U.S. Cl. .......................... 430/320; 430/323; 430/944
[58] Field of Search ....................... 430/311, 313, 430/320, 323, 328, 330, 394, 396, 944

[56] References Cited

U.S. PATENT DOCUMENTS 5,607,814  3/1997  Fan .................................... 430/258

*Primary Examiner*—Kathleen Duda
*Attorney, Agent, or Firm*—Mark K. Johnson

[57] ABSTRACT

A mapping method for producing an infra-red map utilizing IR coatings on substrates such as microscope slides. The invisible map can be used for positioning a microscope platform or for locating microscopic objects without interference from visible or ultraviolet light.

10 Claims, 1 Drawing Sheet

MAPPING METHOD FOR A MICROSCOPE SLIDE

FIELD

The disclosed invention is a method to produce an invisible infrared map on a transparent substrate, including a microscope specimen container, that can be used as a map to align and position the transparent substrate relative to a microscope. In one use, a pattern is etched onto a microscope slide which is a reference for locating suspect atypical cells. The method includes a means to optically mark and locate a specific position during microscopic examinations for clinical testing, for example: Cytology, Histology and Cytogenetics.

BACKGROUND

There is a natural interest in technology which reduces labor and, therefore, costs of clinical microscopic testing. Cervical cytology is a procedure which can provide early diagnosis of cervical cancer in women. Consequently, this procedure is widely and repeatedly used as a screen for cervical cancer with a volume of over 20 million tests per year. Eddy DM, "The Frequency of Cervical Cancer Screening," Cancer 60:1117,1987.

Cervical cancer screening begins with a collection of cells from a cervical scrape. The cells are placed onto microscopic glass slides, fixed and stabilized with alcohol and stained with a Papanicolaou (PAP) stain which reveals diagnostic characteristics of the cells. The stained cells are then manually evaluated in two microscopic steps. First, the cyto-technologist scans each slide and uses a marking pen to mark atypical cells with a dot placed on the cover slip near the cells of interest. The marked slides are then reviewed by a cytopathologist who is responsible for a diagnosis. The cytopathologist places the marked cover slip and slide under a microscope and locates the specific areas identified and marked by the technologist. In this manner, the cytopathologist reviews cells that were selected as possible atypical cells.

Cervical cancer screening typically identifies atypical cells in one out of ten to twenty cervical slides scanned, the remaining slides contain only normal cells. The process of analyzing each slide is labor-intensive requiring a significant period of time to scan over thousands of cells per slide. Recent concerns have focused on the cytotechnologist because heavy workloads have jeopardized performance and have led to errors.

In order to resolve these problems, several companies are developing automated imaging instruments for PAP screening (e.g., Cytec of Boston, and PAPNET of New York). However, several factors limit the potential use of the instruments. First, the projected cost of the new imaging systems is prohibitive such that many laboratories may be unable to purchase such instruments. Second, the Food and Drug Administration (FDA) must approve each device before it can be marketed. Finally, these instruments screen the slides for atypical cells leaving the diagnosis to the cytopathologist, similar to the prior art procedures.

As in routine cytology, cytogenetics requires the manual use of a microscope. Cytogenetics involves fluorescent microscopic techniques employing ultraviolet as well as visible light. A routine chromosome test requires about four hours of microscopic examination identifying and locating specific positions on microscope slides.

In addition to cytology and cytogenetics, microscopic imaging is used to evaluate tissue structure in solid tumors as well as samples with fewer cells such as PAP specimens. However microscopic imaging is a labor intensive process. Measurements using microscopic imaging may require from 15 to 60 minutes per test because the microscope is manually operated.

In the prior art techniques have been developed to produce grid patterns on glass or silicon substrates. Ruddle and Lin describe a method for engraving a grid in glass slides with photographic techniques used for microscope positioning in U.S. Pat. No. 4,415,405. Shearin and Beach described a method to produce an ultraviolet template on glass for integrated circuit production devices in U.S. Pat. No. 3,508,982. Feldman described a method using a photosensitive mask and photochemical etching to produce a metal or color grid on a transparent substrate in U.S. Pat. No. 4,183,614.

SUMMARY OF THE INVENTION

The object of this system is a microscope device constructed by a method for producing a grid pattern utilizing IR coatings on transparent slides that can be used as a map for positioning a microscope platform or for locating microscopic objects without visible or ultraviolet light affecting the microscopic imaging. The system operates with infrared light. This device and method can improve reliability and reduce labor costs in microscopic processes.

A map for use with a microscope comprising, a transparent substrate having a substantially flat surface; an invisible infrared pattern positioned on the surface of the transparent substrate.

A method of producing a map on a surface of a transparent substrate, comprising, coating the surface with an invisible infrared material to produce a substantially uniform coat; applying a pattern to the infrared material; removing the infrared material that is not a portion of the pattern.

A method of producing a map on a transparent substrate surface providing a position of the transparent substrate relative to a microscope, comprising, coating the surface with an invisible infrared material to provide a substantially uniform layer of about 1 to 3 microns; covering the infrared material with a photoresist to provide a substantially uniform layer of about 1 to 2 microns; exposing a portion of the photoresist to an ultra-violet light image causing a chemical transformation of the portion exposed; removing the uncovered infrared material; dissolving the portion of the photoresist exposed to the light image to reveal the infrared material which forms a pattern.

A method of locating positions on a microscope transparent substrate, comprising, forming an invisible map on the transparent substrate; viewing the transparent substrate under a microscope; identifying positions for invisible demarcation; marking the positions electronically by referencing the invisible map; locating the marked positions at a later time with an electronic detector for further viewing.

A means to optically detect microscope position during microscopic examination has been provided with the use of an invisible infrared grid pattern etched onto a microscope transparent substrate which includes a slide and/or coverslip.

Reference is now made in detail to the preferred embodiments of the invention, examples of which are illustrated in the accompanying drawing.

DETAILED DESCRIPTION

Figure 1:
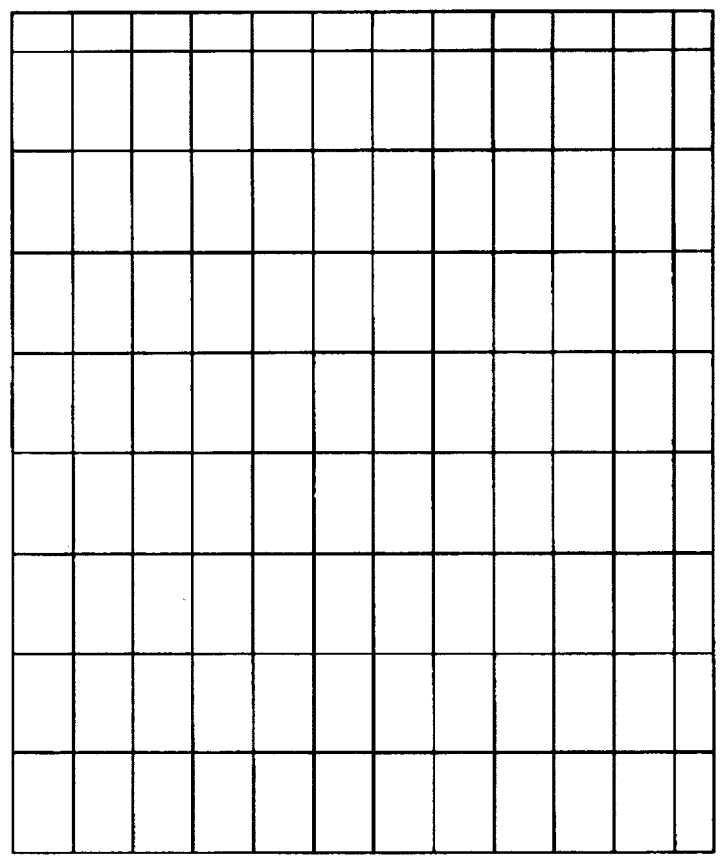
FIG. 1 is a view of an infrared grid pattern for a microscope slide, made visible for descriptive purposes.

In general, the technique is related to semi-conductor fabrication techniques used to make integrated circuits.

Invisible infrared grid patterns (as illustrated in FIG. 1) are etched onto a transparent substrate surface and used as a locator map for microscopic positioning. The process is photographic in nature in that it involves a photochemically induced reaction in a solid medium to cause differential changes on a surface of a solid medium.

In the preferred embodiment, a transparent substrate includes a microscope specimen container such as a slide or cover slip manufactured from any useful transparent material including glass and silicon. The transparent substrate is coated with an invisible infrared (IR) coating. The coating is a "High Pass" optical coating defined as a coating which reflects infrared light (wavelengths longer than 800 nm) and at the same time negligibly affects the transmission of visible light and ultraviolet light (wavelengths between 350 nm to 700 nm) allowing the infrared grid pattern to remain invisible on the transparent substrate to a microscope operator while identifying objects. However, an electronic detector can observe the invisible lines while a microscope operator is viewing slides. When the operator observes an object that he wants to relocate at a later time, he can electronically demarcate the position by an electronic detector that references the infrared grid pattern. At a later time, the same microscope operator or another operator can engage the electronic detector to automatically locate the prior demarcated position. Therefore, the operator does not spend time attempting to locate a desired prior position; the location is found quickly and accurately. In this manner, positions are invisibly marked and/or located while an operator is working with transparent substrates, without interfering with the operator's task, thereby reducing the operator's time spent on each slide. The coated slides are made by Newport Thinfilm Laboratories (Chino, Calif.).

Three infrared coatings may be used in the preferred embodiment: Product identifiers 700-26, 700-30 and 700-40. These IR coatings may range from 1 to 3 µm in uniform thickness on transparent substrates of 0.1 to 1 mm thick. An applied IR coating is optically flat and uniform across the surface of a transparent substrate which has a flat surface and is dimensioned 1×1 inch squares or 1×3 inches in the preferred embodiment. The IR coating is applied using methods known to those skilled in the art to yield a substantially smooth completely covered transparent substrate surface. The IR coated transparent substrates is then baked at approximately 80° C. to remove residual moisture.

The transparent substrate surface is then coated again by depositing a photoresist material, substantially covering the infrared material, and applied in the same manner as the infrared material previously described, achieving a final uniform thickness from about 1 to 1.5 microns ($10^{-6}$ meters) in the preferred embodiment. The photoresist is provided by OCG Micro Electronics Materials, Inc. (Tempe, Ariz.).

The photoresist is a photosensitive organic composition which undergoes chemical transformation upon exposure to light. Both positive and negative photoresist reagents from OCG are acceptable to produce a grid pattern in the IR coating. Positive and negative grid patterns can be produced by exposing the negative resist material to patterns of lines of ultra-violet light. A positive grid pattern consists of a polymerized photoresist matrix of crossing lines. A negative grid pattern consists of clear crossing lines in a checkered pattern of polymerized resist. Negative resist product # SC 100 (from OCG) is utilized in the preferred embodiment because it requires negligible water vapor during curing.

Grid patterns are established in the photoresist layer by projecting a photographic transparency having an image of the desired grid pattern. Photographic transparency types cause the photoresist coating to polymerize upon exposure and the exposed portions are not removed by a developing solution.

A negative transparency is used to project a grid pattern onto the infrared coating. The grid pattern image is focused upon the coating and may be given an enlarged or reduced size. Ultraviolet light passing through the grid pattern image on the negative transparency polymerized the photoresist, thereby forming a polymerized grid pattern on the transparent substrate.

Development with an appropriate developer solution, which dissolves the non-reacting photoresist, fixes the grid pattern image in the coating and removes undeveloped photoresist. Useful developers are known to those skilled in the art. OCG SC 2000 Thinner, PF Developer and SC 2000 Microstripper, from OCG, were used in the preferred embodiment according to the manufacturers directions.

After development, slides were again baked to increase adhesion, to increase resistance to the etchant composition, and to harden the coating. The times and temperatures are adjusted in a manner that favorably affect these features. Such adjustment and manipulation are easily performed by those skilled in the art. Typically temperatures from about 50° C. to about 180° C., with the preferable temperature of 75° C., and times from about 10 to about 120 minutes were employed.

Subsequently, etching takes place selectively in those regions of the coating where the photoresist has been removed by development. The etching step is required to selectively remove infrared material between the photoresist lines.

In the preferred embodiment, hydrofluoric acid, a known etchant, is used to attack and remove ionic material including glass, yet does not affect non-ionic material such as polymerized photoresist. Aqueous solutions of 1 to 10 percent glacial hydrofluoric acid will etch the transparent substrate at temperatures of about 40° C. within a period from about 15 seconds to 30 minutes. Rinsing with water or other similar solvent in which the etchant is soluble is appropriate and will stop the etching process.

Potential difficulties encountered while attempting to obtain a grid pattern include over-etching and undercutting the photoresist. Over-etching and undercutting occur when the etching reaction with hydrofluoric acid is allowed to expose the transparent substrate for a period that is too long. Therefore, times ranging from about 0.25 minutes to 5 minutes are preferable, being careful not to etch the transparent substrate. Adverse affects of etched transparent substrate include amplified edges in the coating grid patterns.

Alternatively, over-etching the transparent substrate or undercutting the photoresist grid patterns are avoided by increasing the viscosity of the etching solution. Sodium Lauryl Sulfate (SDS.mw 288.4 grams) was used to mediate the viscosity of the hydrofluoric acid solution. The hydrofluoric solution is added to dry SDS at a 1:1 volume ratio and allowed to equilibrate for about one hour before applying.

Etched microscope transparent substrates produced by the forgoing process have been used in cytology tests to provide positive location of sights identifying atypical cells. The etched substrate facilitates automated detection of cell position using optical encoding, yet, does not interfere with visible optics required by the technician, diagnostician or for image analysis. Patterns in the typically uniform IR coating on transparent substrates provide a map that can be used to precisely locate positions on the transparent substrate surface.

The following example illustrates some of the features of the system, but the system is not limited by the example.

EXAMPLE

A grid pattern image, as shown in FIG. 1, is placed on a photographic negative. Each line, in the preferred embodiment is about 0.1 mm wide and separated from each other by about 2.2 mm. The patterns were produced in a darkroom (i.e., room without visible or ultraviolet light).

Infrared (IR) coated glass slides obtained from Newport Laboratories (Chino, Calif.), product numbers 700-26, 700-30 and 700-40), are optically flat with uniform optical characteristics across the entire glass surface, reflect IR light and transmit visible light. IR coated slides are first heated to 80° C. for 1 hour in an incubator ("hardbaked") to remove residual water vapor from the surfaces. Slides are removed from the incubator and a drop (about 0.2 ml) of SC 100 photoresist (photoresist reagents were obtained from OCG; Tempe, Ariz.) diluted 1:1 with SC 2000 thinner (from OCG) is placed in the middle of a glass microscope slide. Photoresist is allowed to spread across the slide surface until even and excess is wiped from the edge. Slides are allowed to air dry at room temperature.

Coated slides are placed on a clean horizontal surface and the photographic negative is placed over the slide with the photoresist coating on top. A glass plate is placed over the negative. The resulting sandwich is exposed to ultra-violet (u.v.) light at 350 nm for 5 minutes. The exposure causes chemical cross-linkage (polymerization) where the u.v. light contacts the photoresist material through the clear regions of the negative, and no cross-linkage in the resist where u.v. light is prevented from passing through by the dark regions of the negative.

Exposed slides are removed and treated with PF developer (from OCG), according to the manufacturer's instructions, completing the cross-linkage in the exposed photoresist. Developed slides are heated to 75° C. ("softbake") on a hot plate to remove residual solvents and improve adhesion. The softbake process is performed on a hot plate to avoid contaminating the incubator with solvents. After cooling, the non-polymerized photoresist is removed from the slides with SC 2000 thinner (from OCG), according to manufacturer's instructions. This produces a grid (x-axis lines and y-axis lines) of polymerized photoresist over IR coating on the slide surface.

Within 48 hours, developed slides must be etched with HF. Glacial hydrofluoric acid (48% weight in water) was obtained from Aldrich Chemical Company (Milwaukee, Wis.). Stock solutions of 5% and 10% HF (hydrofluoric acid) were made by adding 10.4 and 20.8 ml of glacial HF, respectively, to distilled water for a final volume of 100 ml.

Patterns in the IR coating of developed slides are produced by exposing them to 5% or 10% aqueous HF. This process selectively removes the IR coating not covered by polymerized photoresist. The stock 5% or 10% HF solutions are placed in plastic cups in a ventilation hood at room temperature. The developed slides are then placed in the cups using plastic forceps for about 0.25 min. to 10 min. It is important not to over-etch the microscopic slide since over-etching affects optics and may undercut the IR coating under the photoresist grid. A 0.25 min. exposure of the developed slide to 5% HF in an ultrasonic agitator followed by submersion in distilled water is preferred. Then, a second 0.25 min. slide exposure to 5% HF, followed by submersion in distilled water from about 15 seconds, removing the excess water and, finally, air drying. The uncovered IR coating material is chemically removed (etched) by the HF solution. The IR coating protected by polymerized photoresist remains intact, producing the desired IR grid on the microscope slide.

The final step in this process is to remove all photoresist by wiping the transparent substrate with a cloth or pad having absorbed SD2000 microstripper (from OCG) until damp.

This process produces slides with IR grid patterns or "maps" that are used for microscope positioning.

The foregoing is considered as illustrative only of the principles of the invention. Further, since numerous modifications and changes will readily occur to those skilled in the art, it is not desired to limit the invention to the exact construction and operation shown and described. Accordingly, all suitable modifications and equivalents fall within the scope of the invention.

We claim:

1. A method of forming a pattern not visible to the human eye on a substrate comprising: applying an infrared material, which is transparent to visible light, on a substantially flat surface of the substrate, then forming the pattern with the infrared material.

2. The method of claim 1 wherein forming the infrared pattern is by a material removal process.

3. The method of claim 2 wherein the material removal process comprises coating the surface of the transparent substrate with a uniform coat of infrared material, then removing a portion of the infrared material.

4. The method of claim 1 wherein forming the pattern comprises covering the infrared material with a uniform coat of photoresist and exposing portions of the photoresist to a light image, thereby chemically transforming portions of the photoresist, and removing the photoresist not exposed to the light image and etching the infrared material formerly covered by the unexposed photoresist.

5. A method of producing a map on a surface of a transparent substrate, comprising: coating the surface with an invisible infrared material, which is transparent to visible light, to produce a substantially uniform coat; patterning the infrared material.

6. The method of claim 5 wherein the transparent substrate consists of a microscope specimen container.

7. The method of claim 6 wherein the microscope specimen container is from the group consisting of a microscope cover slip and a microscope slide.

8. The method of claim 6 wherein the pattern is formed by a process comprising:

depositing a photoresist on the surface to substantially cover the infrared material;

exposing a portion of the photoresist to a pattern of light causing a chemical transformation in the exposed photoresist;

removing the photoresist not exposed and further removing infrared material formerly covered by the unexposed photoresist;

dissolving the portion of the photoresist exposed to light to uncover the infrared material covered by the exposed photoresist.

9. The method of claim 8 wherein removing the infrared material covered by the portion of the photoresist not exposed includes etching the infrared material.

10. The method of claim 9 wherein the pattern is a grid pattern etched by hydrofluoric acid.

* * * * *